US012250848B2

(12) United States Patent
Noh et al.

(10) Patent No.: US 12,250,848 B2
(45) Date of Patent: Mar. 11, 2025

(54) DISPLAY APPARATUS INCLUDING SUBSTRATE HOLE

(71) Applicant: LG Display Co., Ltd., Seoul (KR)

(72) Inventors: So Young Noh, Goyang-si (KR); Kyeong Ju Moon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 36 days.

(21) Appl. No.: 17/364,626

(22) Filed: Jun. 30, 2021

(65) Prior Publication Data

US 2022/0140013 A1 May 5, 2022

(30) Foreign Application Priority Data

Oct. 30, 2020 (KR) ........................ 10-2020-0142879

(51) Int. Cl.
*H10K 59/121* (2023.01)
*H10K 50/844* (2023.01)
*H10K 59/00* (2023.01)
*H10K 59/124* (2023.01)

(52) U.S. Cl.
CPC ......... *H10K 59/121* (2023.02); *H10K 50/844* (2023.02); *H10K 59/00* (2023.02); *H10K 59/124* (2023.02)

(58) Field of Classification Search
CPC ............... H01L 27/3225; H01L 27/326; H01L 27/3258; H01L 51/5253; H04M 1/0266; H10K 59/844; H10K 59/124; H10K 59/00; H10K 59/121
See application file for complete search history.

(56) References Cited

U.S. PATENT DOCUMENTS

| 2017/0148856 | A1* | 5/2017 | Choi | H10K 59/873 |
| 2020/0127231 | A1* | 4/2020 | Yun | H10K 59/873 |
| 2020/0365672 | A1* | 11/2020 | Choi | H10K 59/1213 |
| 2022/0020955 | A1* | 1/2022 | Lee | H10K 59/122 |

FOREIGN PATENT DOCUMENTS

| KR | 10-2020-0014462 A | 2/2020 |
| KR | 10-2020-0063377 A | 6/2020 |
| KR | 10-2020-0111889 A | 10/2020 |

* cited by examiner

*Primary Examiner* — Vongsavanh Sengdara
(74) *Attorney, Agent, or Firm* — Seed IP Law Group LLP

(57) ABSTRACT

Disclosed herein is an organic light emitting display apparatus. The organic light emitting display apparatus includes at least one thin film transistor and light emitting device on substrate, the light emitting device is apart from the substrate hole, and at least one isolation structure is disposed between the substrate hole and the light emitting device. Each thin film transistor includes source/drain electrodes, each light emitting device includes a first electrode, a light emitting layer, and a second electrode, the organic light emitting display apparatus includes a connection electrode connecting one of the source/drain electrodes of the thin film transistor to the first electrode of the light emitting device, and a planarization layer is disposed between the thin film transistor and the light emitting device. The isolation structure includes at least one undercut structure, and a height of each undercut structure is greater than a thickness of the light emitting layer.

19 Claims, 10 Drawing Sheets

DISPLAY APPARATUS INCLUDING SUBSTRATE HOLE

CROSS-REFERENCE TO RELATED APPLICATION(S)

This application claims the benefit of Korean Patent Application No. 10-2020-0142879, filed on Oct. 30, 2020, which is hereby incorporated by reference as if fully set forth herein.

BACKGROUND

Technical Field

The present disclosure relates to a display apparatus including a substrate hole passing through a device substrate.

Description of the Related Art

Generally, electronic devices such as monitors, televisions (TVs), notebook computers, and digital cameras include a display apparatus which displays an image. For example, the display apparatus may include a plurality of light emitting devices. Each of the plurality of light emitting devices may emit light having a specific color. For example, each light emitting device may include a light emitting layer disposed between a first electrode and a second electrode thereof.

Peripheral devices such as a camera, a speaker, and a sensor may be embedded into the display apparatus. For example, the display apparatus may include a substrate hole passing through a device substrate which supports the light emitting devices. The substrate hole may be disposed between the light emitting devices. The peripheral devices may be inserted into the substrate hole.

BRIEF SUMMARY

However, the inventors of the present disclosure have recognized that, in the display apparatus, external moisture may penetrate into the display apparatus through the substrate hole. The inventors have further appreciated that external moisture penetrating through the substrate hole may move to the light emitting devices adjacent to the substrate hole through the light emitting layer. Therefore, in the display apparatus, the light emitting devices adjacent to the substrate hole may be damaged by the external moisture penetrating through the substrate hole.

To overcome the aforementioned problem of the related art as well as other technical problems present in the related art, the inventors of the present disclosure have provided a display apparatus for preventing a light emitting device from being damaged by external moisture penetrating through a substrate hole.

The present disclosure may provide a display apparatus in which a process of preventing the penetration of external moisture is simplified.

To achieve these technical benefits and other advantages and in accordance with the one or more embodiments of the disclosure, as embodied and broadly described herein, a display apparatus includes a substrate hole passing through a substrate.

In an embodiment of the present disclosure, the display apparatus may include at least one thin film transistor and light emitting device on the substrate, the light emitting device may be apart from the substrate hole, and at least one isolation structure may be disposed between the substrate hole and the light emitting device.

Each thin film transistor may include a source/drain electrode, each light emitting device may include a first electrode, a light emitting layer, and a second electrode, the display apparatus may include a connection electrode connecting one of the source/drain electrodes of the thin film transistor to the first electrode of the light emitting device, and a planarization layer may be disposed between the thin film transistor and the light emitting device.

The at least one isolation structure may include at least one undercut structure, and a height of each undercut structure may be greater than a thickness of the light emitting layer.

The undercut structure of the isolation structure may include a first structure that is the same material as that of the planarization layer and a second structure that is the same material as that of the connection electrode. The undercut structure may be provided in plurality on an insulation layer.

The light emitting layer may be disposed on the second structure of the isolation structure, and the light emitting layer may be further disposed with an island shape on the insulation layer between the plurality of isolation structures.

The light emitting layer having the island shape has a center portion and both ends being disposed on the same horizontal line.

The light emitting layer having the island shape has a center portion and both ends, and both ends may be farther away from the substrate than the center portion of the light emitting layer.

The at least one thin film transistor may include a first thin film transistor and a second thin film transistor, a semiconductor pattern of the first thin film transistor may include low temperature poly-silicon (LTPS), and a semiconductor pattern of the second thin film transistor may include an oxide semiconductor.

In another embodiment of the present disclosure, a substrate may include a substrate hole region and a pixel area, the substrate hole region may include a substrate hole and a hole periphery region, the pixel area may include a thin film transistor and a light emitting device, the substrate hole may be disposed between light emitting devices, at least one isolation structure may be provided between the substrate hole and the light emitting device, an encapsulation part may be provided on the pixel area and the isolation structure.

The light emitting devices may include a first electrode, a light emitting layer, and a second electrode.

The encapsulation part may include a first inorganic encapsulation layer, a second organic encapsulation layer, and a third inorganic encapsulation layer.

The display apparatus may further include a connection electrode connecting one of source and drain electrodes of the thin film transistor to the first electrode of the light emitting device and may further include a planarization layer disposed between the thin film transistor and the light emitting device.

The hole periphery region may include an isolation region, a plurality of isolation structures may be disposed in the isolation region, and the gate insulation layer, the interlayer insulation layer, and the isolation layer of the pixel area may not extend.

The first inorganic encapsulation layer may cover a side surface of each of the gate insulation layer, the interlayer insulation layer, and the isolation layer exposed between the pixel area and the isolation region with contact.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
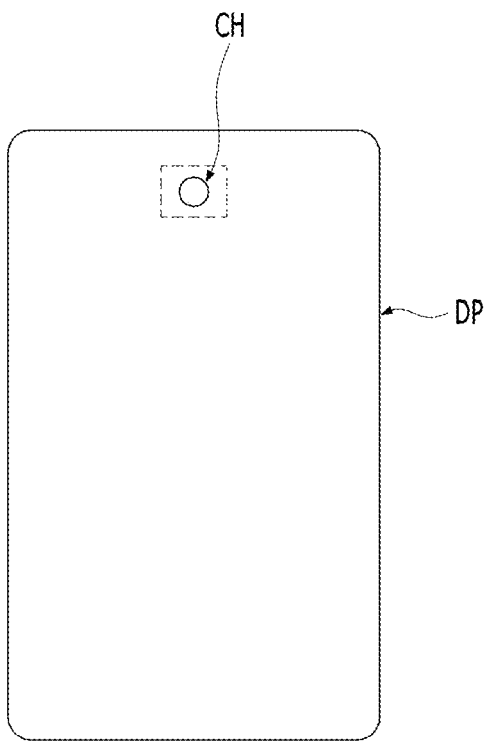
FIG. 1 is a diagram schematically illustrating a display apparatus according to an embodiment of the present disclosure.

Hereinafter, the present disclosure will be described more fully with reference to the accompanying drawings, in which one or more embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art.

Moreover, like reference numerals refer to like elements throughout, and in the drawings, for convenience, a length or thickness of a layer or a region may be exaggeratedly illustrated. Furthermore, a case where a first element is described as being "on" a second element may include a case where the first element is disposed on an upper portion directly contacting the second element and a case where a third element is disposed between the first element and the second element.

It will be understood that although the terms including an ordinary number such as first or second are used herein to describe various elements, these elements should not be limited by these terms. These terms are only used to distinguish one element from another element. Also, based on convenience of those skilled in the art, a first element and a second element may be arbitrarily referred to without departing from the spirit and scope of the present disclosure.

The technical terms are used only for explaining a specific example embodiment while not limiting the present disclosure. The terms of a singular form may include plural forms unless referred to the contrary. The terms described in the specification should be understood as follows. As used herein, the singular forms "a," "an" and "the" are intended to include the plural forms as well, unless the context clearly indicates otherwise. The terms "first" and "second" are for differentiating one element from the other element, and these elements should not be limited by these terms. It will be further understood that the terms "comprises," "comprising," "has," "having," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
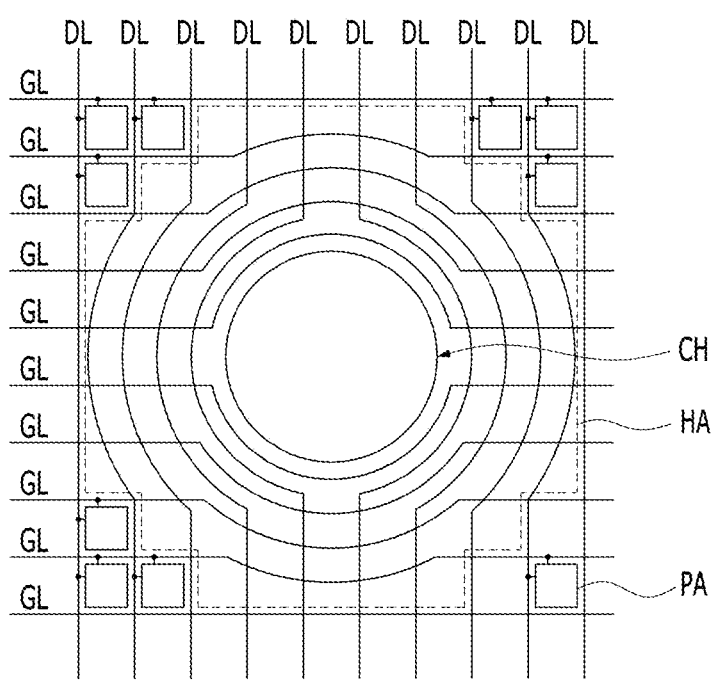
FIG. 2 is an enlarged view of a periphery of a substrate hole in a display apparatus according to an embodiment of the present disclosure.
Figure 3:
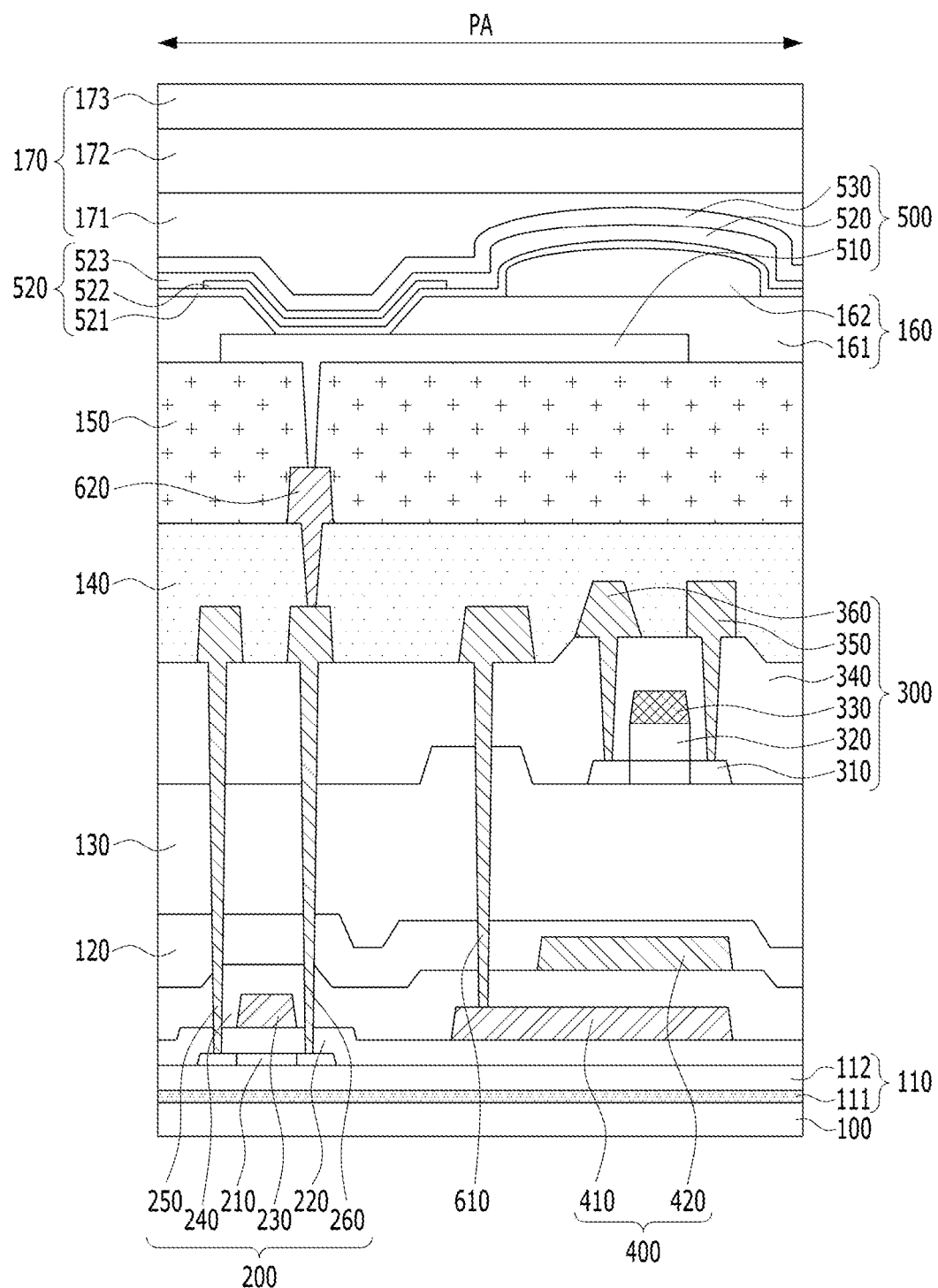
FIG. 3 is a diagram illustrating a cross-sectional surface of a pixel in a display apparatus according to an embodiment of the present disclosure.
Figure 4:
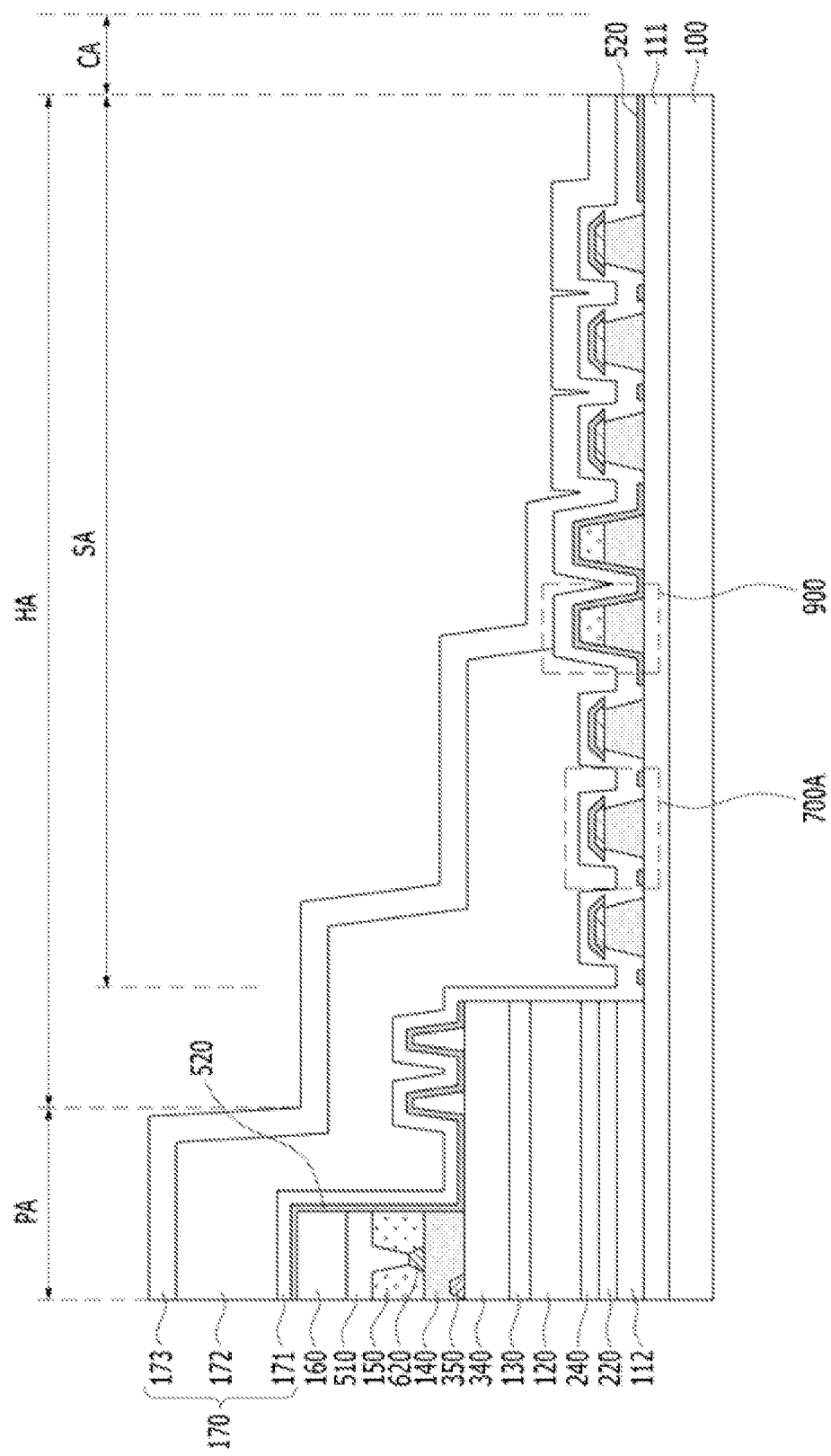
FIG. 4 is a diagram illustrating a cross-sectional surface of a peripheral region of a substrate hole in a display apparatus according to an embodiment of the present disclosure.
Figure 5:
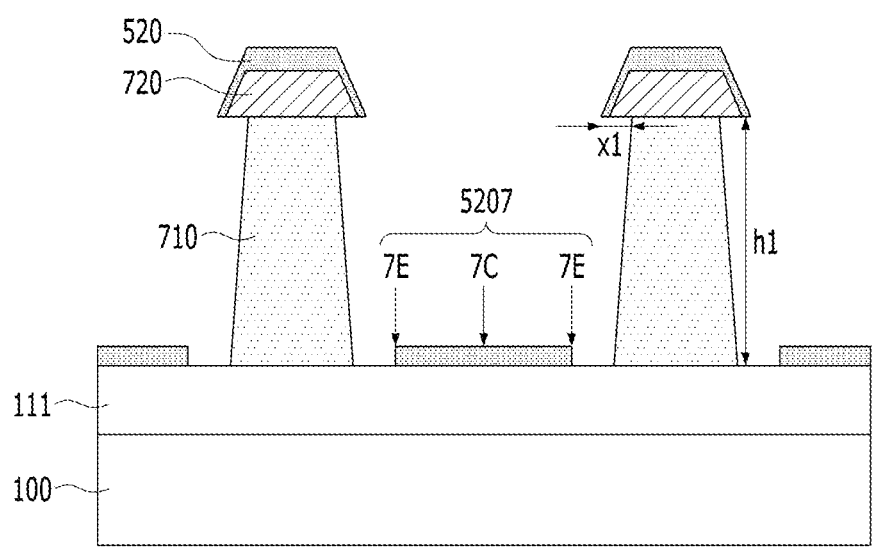
FIG. 5 is an enlarged view of a region 700A of FIG. 4.

FIG. 1 is a diagram schematically illustrating a display apparatus according to an embodiment of the present disclosure. FIG. 2 is an enlarged view of a periphery of a substrate hole in a display apparatus according to an embodiment of the present disclosure. FIG. 3 is a diagram illustrating a cross-sectional surface of a pixel in a display apparatus according to an embodiment of the present disclosure. FIG. 4 is a diagram illustrating a cross-sectional surface of a peripheral region of a substrate hole in a display apparatus according to an embodiment of the present disclosure. FIG. 5 is an enlarged view of a region 700A of FIG. 4.

Referring to FIGS. 1 to 5, a display apparatus DP according to an embodiment of the present disclosure may include a substrate 100.

The substrate 100 may include a plurality of pixel areas PA which are defined by a plurality of gate lines GL and a plurality of data lines DL. A light emitting device 500 may be disposed in each of the pixel areas PA. Each of the light emitting devices 500 may emit light having a specific color. For example, each light emitting device 500 may include a first electrode 510, a light emitting layer 520, and a second electrode 530, which are sequentially stacked.

The first electrode 510 may include a conductive material. The first electrode 510 may include metal which is relatively high in reflectance. The first electrode 510 may have a multi-layer structure. For example, the first electrode 510 may have a structure where a reflection electrode including metal such as aluminum (Al) or silver (Ag) is disposed between transparent electrodes including a transparent conductive material such as indium tin oxide (ITO) or indium zinc oxide (IZO).

The light emitting layer 520 may emit light having luminance corresponding to a voltage difference between the first electrode 510 and the second electrode 520. For example, the light emitting layer 520 may include a light emitting material layer (EML) 522 including a light emitting material. The light emitting material may include an organic material, an inorganic material, or a hybrid material. For example, the display apparatus DP according to an embodiment of the present disclosure may be an organic light emitting display apparatus including the light emitting layer 520 including an organic material.

The light emitting layer 520 may have a multi-layer structure, for increasing emission efficiency. For example, the light emitting layer 520 may further include at least one first organic layer 521, disposed between the first electrode 510 and the light emitting material layer 522, and at least one second organic layer 523 disposed between the light emitting material layer 522 and the second electrode 530. The first organic layer 521 may include at least one of a hole injecting layer (HIL) and a hole transporting layer (HTL). Also, the second organic layer 523 may include at least one of an electron transporting layer (ETL) and an electron injecting layer (EIL). However, the present disclosure is not limited thereto. For example, the first organic layer 521 may include at least one of the electron transporting layer (ETL) and the electron injecting layer (EIL), and the second organic layer 523 may include at least one of the hole injecting layer (HIL) and the hole transporting layer (HTL).

The second electrode 530 may include a conductive material. The second electrode 530 may include a material which differs from that of the first electrode 510. For example, the second electrode 530 may be a transparent electrode including a transparent conductive material such as ITO or IZO. Accordingly, in the display apparatus DP according to an embodiment of the present disclosure, light emitted from the light emitting layer 520 of each pixel area PA may be irradiated to the outside through the second electrode 530.

An encapsulation part 170 may be formed to cover the light emitting device 500 so as to prevent moisture from penetrating into the light emitting device 500. For example, the encapsulation part 170 for preventing the penetration of moisture may be disposed on the second electrode 530 of the light emitting device 500.

The encapsulation part 170 may include at least one inorganic encapsulation layer and at least one organic encapsulation layer. For example, the encapsulation part 170 may include a first encapsulation layer 171 including an inorganic material, a second encapsulation layer 172 including an organic material, and a third encapsulation layer 173 including an inorganic material. The first encapsulation layer 171 of the encapsulation part 170 may be disposed on the second electrode 213. Also, the second encapsulation layer 172 may be disposed on the first encapsulation layer 171. Also, the third encapsulation layer 173 may be disposed on the second encapsulation layer 172. The first encapsulation layer 171 and the third encapsulation layer 173 of the encapsulation part 170 may include an inorganic material such as nitride silicon (SiNx) or oxide silicon (SiOx). The second encapsulation layer 172 of the encapsulation part 170 may include an organic material such as acryl resin, epoxy resin, phenolic resin, polyamide resin, or polyimide resin.

Each light emitting device 500 may be supplied with a driving current which corresponds to a gate signal applied thereto through a corresponding gate line GL and a data signal applied thereto through a corresponding data line DL. For example, a driving circuit electrically connected to a corresponding light emitting device 500 may be disposed in each pixel area PA. The driving circuit may control an operation of a corresponding light emitting device 500 on the basis of the gate signal and the data signal. For example, the driving circuit may include a first thin film transistor (TFT) 200, a second TFT 300, and a storage capacitor 400.

The first TFT 200 may include a first semiconductor pattern 210, a first gate insulation layer 220, a first gate electrode 230, a first interlayer insulation layer 240, a first source electrode 250, and a first drain electrode 260.

The first semiconductor pattern 210 may be disposed close to the substrate 100. The first semiconductor pattern 210 may include a semiconductor material. For example, the first semiconductor pattern 210 may include poly-silicon (poly-Si) which is a polycrystalline semiconductor material. In the specification, the first semiconductor pattern 210 may include low temperature poly-Si (LTPS).

The first semiconductor pattern 210 may include a first source region, a second drain region, and a first channel region. The first channel region may be disposed between the first source region and the first drain region. The first channel region may have conductivity which is relatively lower than that of each of the first source region and the first drain region. For example, the first source region and the first drain region may be higher in content of conductive impurities than the first channel region.

The first gate insulation layer 220 may be disposed on the first semiconductor pattern 210. The first gate insulation layer 220 may extend toward an outer portion of the first semiconductor pattern 210. The first gate insulation layer 220 may include an insulating material. For example, the first gate insulation layer 220 may include a silicon oxide (SiOx) material. The SiOx material may include silicon dioxide ($SiO_2$).

The first gate electrode 230 may be disposed on the first gate insulation layer 220. For example, the first gate electrode 230 may overlap the first channel region of the first semiconductor pattern 210. The first gate electrode 230 may be insulated from the first semiconductor pattern 210 by the first gate insulation layer 220. The first gate electrode 230 may include a conductive material. For example, the first gate electrode 230 may include metal such as aluminum (Al), chromium (Cr), copper (Cu), titanium (Ti), molybdenum (Mo), or tungsten (W).

The first interlayer insulation layer 240 may be disposed on the first gate insulation layer 220 and the first gate electrode 230. The first interlayer insulation layer 240 may extend along the first gate insulation layer 220. The first interlayer insulation layer 240 may include an insulating material. The first interlayer insulation layer 240 may include a material which differs from that of the first gate insulation layer 220. For example, the first interlayer insulation layer 240 may include a silicon oxide (SiOx) material.

The first source electrode 250 may be electrically connected to the first source region of the first semiconductor pattern 210. The first interlayer insulation layer 240 may include a first source contact hole which partially exposes the first source region of the first semiconductor pattern 210. The first source electrode 250 may include a region which overlaps the first source region of the first semiconductor pattern 210.

The first source electrode 250 may include a conductive material. For example, the first source electrode 250 may include metal such as Al, Cr, Mo, W, Ti, or Cu.

The first drain electrode 260 may be electrically connected to the first drain region of the first semiconductor pattern 210. The first interlayer insulation layer 240 may include a first drain contact hole which partially exposes the first drain region of the first semiconductor pattern 210. The first drain electrode 260 may include a region which overlaps the first drain region of the first semiconductor pattern 210.

The first drain electrode 260 may include a conductive material. For example, the first drain electrode 260 may include metal such as Al, Cr, Mo, W, Ti, or Cu. The first drain electrode 260 may include the same material as that of the first source electrode 250. For example, the first drain electrode 260 may be formed by the same process as the first source electrode 250.

The first source electrode 250 and the first drain electrode 260 may each be formed in a multi-layer structure. For example, the first source electrode 250 and the first drain electrode 260 may each be formed of a triple layer. In a case where each of the first source electrode 250 and the first drain electrode 260 is formed of a triple layer, a lower layer and an upper layer may each be formed of a Ti metal layer, and a middle layer disposed between the lower layer and the upper layer may be formed of an Al metal layer.

The second TFT 300 may be formed through a process which differs from the first TFT 200. For example, the second TFT 300 may be disposed on a second isolation layer 130 of the first TFT 200. The second isolation layer 130 may include an insulating material. The second isolation layer 130 may include a material which differs from that of the first interlayer insulation layer 240. For example, the second isolation layer 130 may include a material which differs from that of the first interlayer insulation layer 240. For example, the second isolation layer 130 may include a silicon nitride (SiNx) material.

A structure of the second TFT 300 may be the same as that of the first TFT 200. For example, the second TFT 300 may include a second semiconductor pattern 310, a second gate insulation layer 320, a second gate electrode 330, a second interlayer insulation layer 340, a second source electrode 350, and a second drain electrode 360.

The second semiconductor pattern 310 may be disposed close to the second isolation layer 130. For example, the second semiconductor pattern 310 may directly contact the second isolation layer 130. The second semiconductor pattern 310 may include a semiconductor material. The second semiconductor pattern 310 may include a material which differs from that of the first semiconductor pattern 210. For example, the second semiconductor pattern 310 may include an oxide semiconductor such as indium gallium zinc oxide (IGZO).

The second semiconductor pattern 310 may include a second source region, a second drain region, and a second channel region. The second channel region may be disposed between the second source region and the second drain region. A resistance of the second source region and a resistance of the second drain region may be lower than that of the second channel region. For example, the second source region and the second drain region may each be a conductive region. The second channel region may be a nonconductive region.

The second gate insulation layer 320 may be disposed on the second semiconductor pattern 310. The second gate insulation layer 320 may include an insulating material. For example, the second gate insulation layer 320 may include a SiOx material, a SiNx material, and/or a material having a high dielectric constant (a high-k material). The second gate insulation layer 320 may have a multi-layer structure.

The second gate insulation layer 320 may expose the second source region and the second drain region of the second semiconductor pattern 310. The second source region and the second drain region of the second semiconductor pattern 310 may not overlap the second gate insulation layer 320. For example, the second source region and the second drain region of the second semiconductor pattern 310 may have conductivity on the basis of an etching process which is used in a process of patterning the second gate insulation layer 320.

The second gate electrode 330 may be disposed on the second gate insulation layer 320. For example, the second gate electrode 330 may overlap the second channel region of the second semiconductor pattern 310. The second gate electrode 330 may include a conductive material. For example, the second gate electrode 330 may include metal such as Al, Cr, Cu, Ti, Mo, and W. The second gate electrode 330 may include the same material as that of the first gate electrode 230.

The second interlayer insulation layer 340 may be disposed on the second semiconductor pattern 310 and the second gate electrode 330. The second interlayer insulation layer 340 may include an insulating material. The second interlayer insulation layer 340 may include a material which differs from that of the first interlayer insulation layer 240. For example, the second interlayer insulation layer 340 may include a SiNx material.

The second source electrode 350 may be disposed on the second interlayer insulation layer 340. The second source electrode 350 may be electrically connected to the second source region of the second semiconductor pattern 310. For example, the second interlayer insulation layer 340 may include a second source contact hole which partially exposes the second source region of the second semiconductor pattern 310. The second source electrode 350 may include a region which overlaps the second source region of the second semiconductor pattern 310.

The second source electrode 350 may include a conductive material. For example, the second source electrode 350 may include metal such as Al, Cr, Mo, W, Ti, or Cu. The second source electrode 350 may include the same material as that of the first source electrode 250.

The second drain electrode 360 may be disposed on the second interlayer insulation layer 340. The second drain electrode 360 may be electrically connected to the second drain region of the second semiconductor pattern 310. For example, the second interlayer insulation layer 340 may include a second drain contact hole which partially exposes the second drain region of the second semiconductor pattern 310. The second drain electrode 360 may include a region which overlaps the second drain region of the second semiconductor pattern 310.

The second drain electrode 360 may include a conductive material. For example, the second drain electrode 360 may include metal such as Al, Cr, Mo, W, Ti, or Cu. The second drain electrode 360 may include the same material as that of the second source electrode 350. For example, the second drain electrode 360 may be formed by the same process as the second source electrode 350.

The second source electrode 350 and the second drain electrode 360 may each be formed in a multi-layer structure. For example, the second source electrode 350 and the second drain electrode 360 may each be formed of a triple layer. In a case where each of the second source electrode 350 and the second drain electrode 360 is formed of a triple layer, a lower layer and an upper layer may each be formed of a Ti metal layer, and a middle layer disposed between the lower layer and the upper layer may be formed of an Al metal layer.

The first source electrode 250, the first drain electrode 260, the second source electrode 350, and the second drain electrode 360 may be disposed on the second interlayer insulation layer 340 and may be formed of the same material through the same process.

The storage capacitor 400 may be formed between the substrate 100 and the second TFT 300. For example, the storage capacitor 400 may include a first storage electrode 410, disposed on the same layer as the first gate electrode 230, and a second storage electrode 420 disposed on the first interlayer insulation layer 240 over the first storage electrode 410.

The first storage electrode 410 may include a conductive material. The first storage electrode 410 may include metal such as Al, Cr, Mo, W, Ti, or Cu. The first storage electrode 410 may include the same material as that of the first gate electrode 230. For example, the first storage electrode 410 may be formed by the same process as the first gate electrode 230.

The second storage electrode 420 may include a conductive material. The second storage electrode 420 may include metal such as Al, Cr, Mo, W, Ti, or Cu. The first interlayer insulation layer 240 may extend to a region between the first storage electrode 410 and the second storage electrode 420. The second storage electrode 420 may be disposed on the first interlayer insulation layer 240.

The first source electrode 250 and the first drain electrode 260 may be disposed on a layer which differs from the first storage electrode 420. For example, the first isolation layer 120 covering the second storage electrode 420 may extend to a region between the first interlayer insulation layer 240 and the first source electrode 250 and a region between the first interlayer insulation layer 240 and the first drain electrode 260. The first isolation layer 120 is disposed between the second isolation layer 130 and the first interlayer insulation layer 240.

The first interlayer insulation layer 240 and the first isolation layer 120 may be sequentially stacked between the first gate electrode 230 and the first source electrode 250 and between the first gate electrode 230 and the first drain electrode 260. The second storage electrode 420 may include a material which differs from that of each of the first source electrode 250 and the first drain electrode 260.

The first isolation layer 120 may include an insulating material. For example, the first isolation layer 120 may include SiOx and/or SiNx. The first isolation layer 120 may have a multi-layer structure. The first source electrode 250 and the first drain electrode 260 may be disposed on the second interlayer insulation layer 340. However, the present disclosure is not limited thereto.

The first storage electrode 410 may be electrically connected to the second drain electrode 360 of the second TFT 300. For example, a first middle electrode 610 passes through the first interlayer insulation layer 240, the first isolation layer 120, the second isolation layer 130, and the second interlayer insulation layer 340. The first middle electrode 610 is connected to the first storage electrode 410, and the second drain electrode 360 may be connected to the first middle electrode 610. The first middle electrode 610 may include a conductive material. For example, the first middle electrode 610 may include metal such as Al, Cr, Mo, W, Ti, or Cu. The first middle electrode 610 may include the same material as that of each of the first source electrode 250, the first drain electrode 260, the second source electrode 350, and the second drain electrode 360. For example, the first middle electrode 610 may be formed through the same process as the first source electrode 250, the first drain electrode 260, the second source electrode 350, and the second drain electrode 360.

A buffer insulation layer 110 may be disposed between the device substrate 100 and a driving circuit (for example, a TFT and a storage capacitor) of each pixel area PA. The buffer insulation layer 110 may prevent pollution caused by the device substrate 100 in a process of forming the driving circuit. For example, the buffer insulation layer 110 may extend to a region between the device substrate 100 and the first semiconductor pattern 210 of each pixel area PA. The buffer insulation layer 110 may include an insulating material. For example, the buffer insulation layer 110 may include a SiOx material and/or a SiNx material. The buffer insulation layer 110 may have a multi-layer structure. For example, the buffer insulation layer 110 may have a stack structure of a first buffer insulation layer 111 and a second buffer insulation layer 112 including a material which differs from that of the first buffer insulation layer 111.

A first planarization layer 140 and a second planarization layer 150 may be sequentially stacked between the second TFT 300 and the light emitting device 500 of each pixel area PA. The first planarization layer 140 and the second planarization layer 150 may remove a step height caused by the driving circuit of each pixel area PA. For example, a surface of the second planarization layer 150 facing the light emitting device 500 of each pixel area PA may be a flat surface. The first planarization layer 140 and the second planarization layer 150 may include an insulating material. The first planarization layer 140 and the second planarization layer 150 may include a material which differs from that of the second interlayer insulation layer 340. For example, the first planarization layer 140 and the second planarization layer 150 may include an organic insulating material. The second planarization layer 150 may include a material which differs from that of the first planarization layer 140.

The light emitting device 500 of each pixel area PA may be electrically connected to the first TFT 200 of a corresponding pixel area PA, and the first electrode 510 may be electrically connected to the first drain electrode 260 through a first connection electrode 620. For example, the first connection electrode 620 may be disposed between the first planarization layer 140 and the second planarization layer 150. The first connection electrode 620 may pass through the first planarization layer 140 and may be connected to the first drain electrode 260, and the first electrode 510 may pass through the second planarization layer 150 and may be connected to the first connection electrode 620.

The first connection electrode 620 may include a conductive material. For example, the first connection electrode 620 may include metal such as Al, Cr, Mo, W, Ti, or Cu.

The light emitting device 500 of each pixel area PA may be independently driven. For example, the first electrode 510 of each pixel area PA may be insulated from the first electrode 510 of an adjacent pixel area PA. An edge of each first electrode 510 may be covered by a bank/spacer insulation layer 160 which includes a bank insulation layer 161 and a spacer insulation layer 162. The bank/spacer insulation layer 160 may be disposed on the second planarization layer 150. The light emitting layer 520 and the second electrode 530 of each pixel area PA may be stacked on a corresponding first electrode 510 exposed by the bank/spacer insulation layer 160. The bank/spacer insulation layer 160 may include an insulating material. For example, the bank/spacer insulation layer 160 may include an organic insulating material. The bank/spacer insulation layer 160 may include a material which differs from that of the second planarization layer 150.

At least a portion of the light emitting layer 520 of each pixel area PA may extend to the bank/spacer insulation layer 160. For example, the first organic layer 521 and the second organic layer 523 of each pixel area PA may be connected to the first organic layer 521 and the second organic layer 523 of an adjacent pixel area PA. The light emitting material layer 522 of each pixel area PA may be apart from the light emitting material layer 522 of an adjacent pixel area PA. The second electrode 530 of each pixel area PA may extend to the bank/spacer insulation layer 160. For example, the second electrode 530 of each pixel area PA may be connected to the second electrode 530 of an adjacent pixel area PA.

According to an embodiment of the present disclosure, the first TFT 200 may perform a function of a driving transistor. Therefore, the first electrode 510 of the light emitting device 500 may be connected to the first TFT 200, but is not limited thereto. For example, the first electrode 510 of the light emitting device 500 may be connected to the second TFT 300. Also, the second TFT 300 may perform a function of a driving transistor.

A substrate hole CH may be formed in the device substrate 100. The substrate hole CH may pass through the device substrate 100. The substrate hole CH may be disposed between the pixel areas PA. For example, the substrate hole CH may be formed between the light emitting devices 500. The device substrate 100 may include a hole periphery region HA including a region where the substrate hole CH is formed. The light emitting devices 500 may be disposed outside the hole periphery region HA. In the hole periphery region HA, the gate line GL and the data line DL may bypass an edge of the substrate hole CH.

The hole periphery region HA may include an isolation region SA at least partially surrounding a through region CA where the substrate hole CH is formed. For example, the isolation region SA may be disposed between the through region CA and the pixel areas PA.

At least one isolation structure 700A and dam 900 may be disposed in the isolation region SA. In each isolation structure 700A, a first structure 710 and a second structure 720 may be sequentially stacked and disposed. For example, the first structure 710 may include the same material as that of the first planarization layer 140, and the second structure 720 may include the same material as that of the first connection electrode 620.

An upper area of the first structure 710 contacting the second structure 720 may be formed to be less than a lower area of the second structure 720 contacting the first structure 710. For example, the isolation structure 700A may include an undercut structure, based on a width (x1) difference between the first structure 710 and the second structure 720.

Each undercut structure may have a depth h1 which is the same as a thickness of a corresponding first structure 710. For example, the depth h1 of the undercut structure formed by the first structure 710 and the second structure 720 may be the same as a thickness of the first structure 710. The depth h1 of the undercut structure may be greater than a thickness of the light emitting layer 520 which extends to the hole periphery region HA. For example, the depth h1 of each undercut structure may be greater than a sum of a thickness of the first organic layer 521 and a thickness of the second organic layer 523.

Therefore, in an organic light emitting display apparatus according to an embodiment of the present disclosure, the light emitting layer 520 deposited on the isolation region SA may be completely isolated by the isolation structure 700A. For example, the first organic layer 521 and the second organic layer 523 of the light emitting layer 520 may be completely isolated from each other by the isolation structure 700A. Accordingly, in the display apparatus according to an embodiment of the present disclosure, the penetration of external moisture through the light emitting layer 520 may be prevented by the isolation structure 700A.

Moreover, in an organic light emitting display apparatus according to an embodiment of the present disclosure, the isolation structure 700A disposed between the dam 900 and the through region CA may prevent the dam 900 and the second encapsulation layer 172 including an organic material from being diffused to the through region CA. Therefore, a thin film layer including an organic material may not be disposed in the through area CA, and thus, a laser trimming process of forming the substrate hole CH may be easily performed. The isolation structure 700A may be formed by a process of forming the first TFT 200 and the second TFT 300 and a process of forming the light emitting device 500. For example, a process of forming the isolation structure 700A may include a process of etching the second buffer layer 112, the first gate insulation layer 220, the first interlayer insulation layer 240, the first isolation layer 120, the second isolation layer 130, and the second interlayer insulation layer 340 in the isolation region SA by using a mask pattern of a process of forming the first and second source contact holes and the first and second drain contact holes.

A plurality of isolation structures 700A disposed in the isolation region SA may be removed by the etching process, and then, may be placed on the first buffer insulation layer 111 remaining. A light emitting layer 5207 isolated by the plurality of isolation structures 700A disposed in the isolation region SA may be arranged in an island shape on the first buffer insulation layer 111 exposed between the isolation structures 700A.

The light emitting layer 5207 isolated in an island shape may extend along the same horizontal line as the device substrate 100. For example, both end portions 7E and a center portion 7C of the isolated light emitting layer 5207 may be disposed on the same horizontal line.

The light emitting device 500 and the at least one isolation structure 700A may be covered and protected by the encapsulation part 170. For example, in order to prevent moisture from penetrating into the light emitting device 500 disposed in the pixel area PA, the encapsulation part 170 may extend and may be stacked on the isolation structure 700A disposed in the isolation region SA. A side surface of each of the second buffer insulation layer 112, the first gate insulation layer 220, the first interlayer insulation layer 240, the first isolation layer 120, the second isolation layer 130, and the second interlayer insulation layer 340, which are exposed between the isolation region SA and the pixel area PA through the etching process, may contact the first encapsulation layer 171 including an inorganic material.

Figure 6:
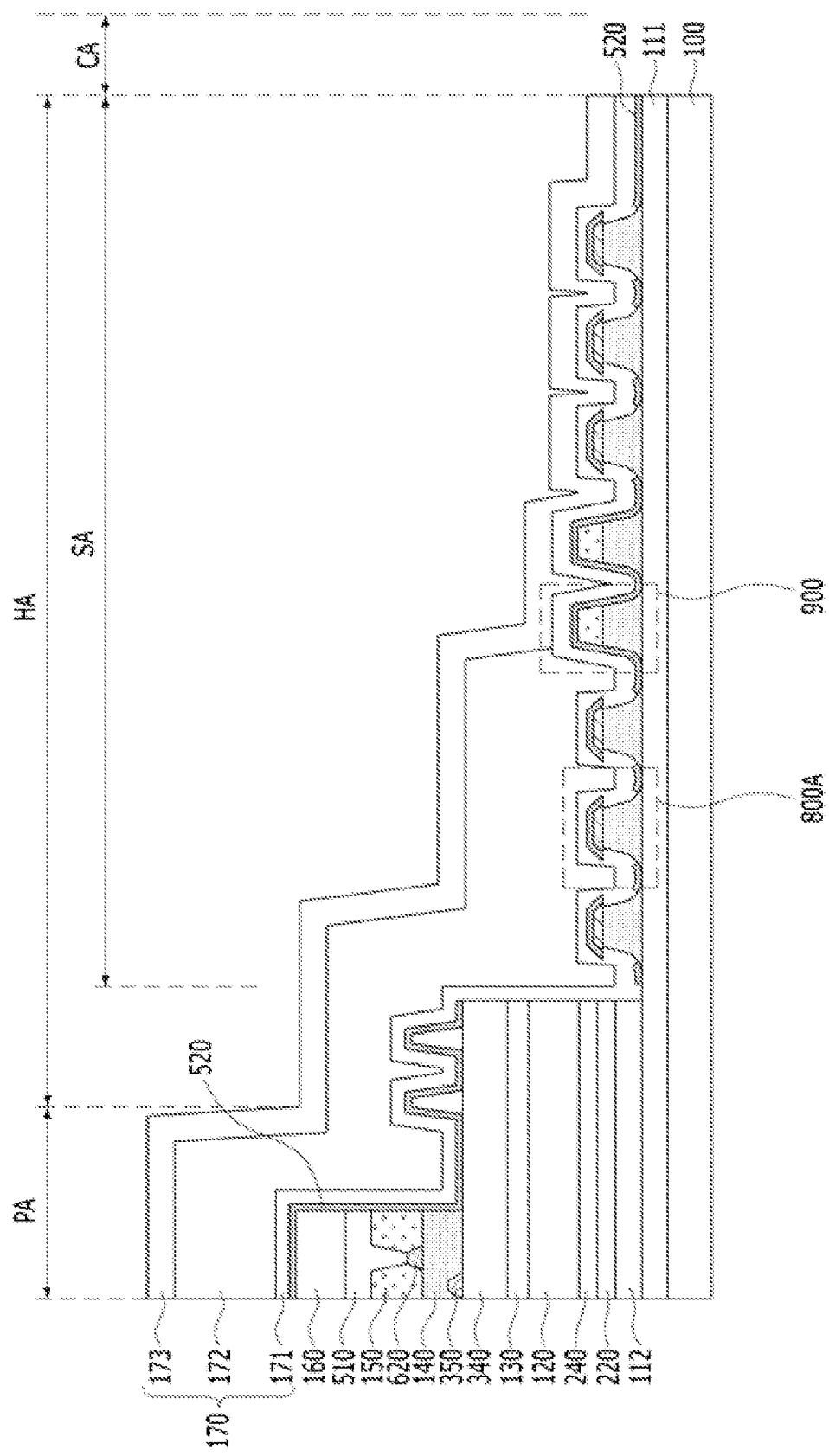
FIG. 6 is a diagram illustrating a display apparatus according to another embodiment of the present disclosure.
Figure 7:
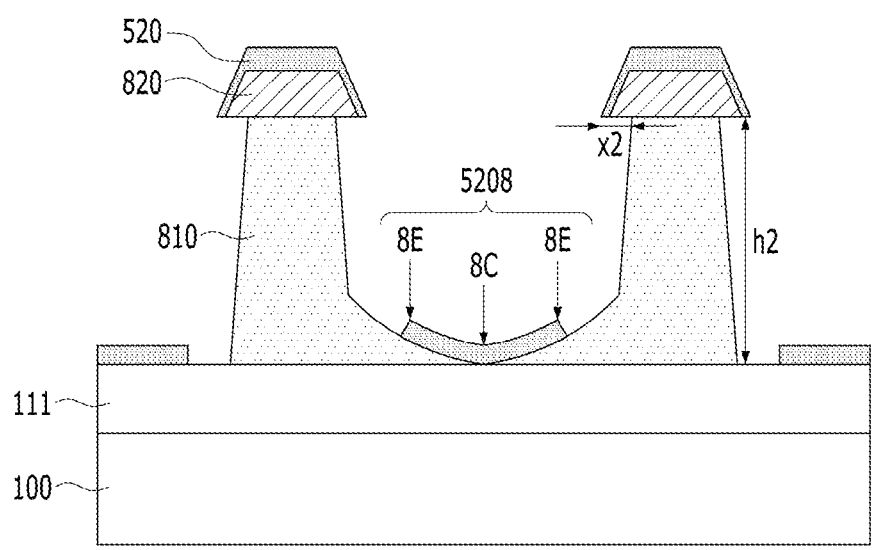
FIG. 7 is an enlarged view of a region 800A of FIG. 6.

Referring to FIGS. 6 and 7, another embodiment of another isolation structure of a display apparatus DP according to the present disclosure is illustrated. Configurations of a first TFT 200, a second TFT 300, and a light emitting device 500 of a pixel area PA may be substantially the same as those of FIGS. 1 to 3.

At least one isolation structure 800A and dam 900 may be disposed in the isolation region SA of FIGS. 6 and 7. Each of the isolation structures 800A may include a first structure 810 and a second structure 820, which are sequentially stacked and disposed. For example, the first structure 810 may include the same material as that of the first planarization layer 140, and the second structure 820 may include the same material as that of the first connection electrode 620.

An upper area of the first structure 810 contacting the second structure 820 may be formed to be less than a lower area of the second structure 820 contacting the first structure 810. For example, the isolation structure 800A may include an undercut structure, based on a width (x2) difference between the first structure 810 and the second structure 820.

Each undercut structure may have a depth h2 which is the same as a thickness of a corresponding first structure 810. For example, the depth h2 of the undercut structure formed by the first structure 810 and the second structure 820 may be the same as a thickness of the first structure 810. The depth h2 of the undercut structure may be greater than a thickness of the light emitting layer 520 which extends to the hole periphery region HA. For example, the depth h2 of each undercut structure may be greater than a sum of a thickness of the first organic layer 521 and a thickness of the second organic layer 523.

Therefore, in an organic light emitting display apparatus according to an embodiment of the present disclosure, the light emitting layer 520 deposited on the isolation region SA may be completely isolated by the isolation structure 800A. For example, the first organic layer 521 and the second organic layer 523 of the light emitting layer 520 may be completely isolated from each other by the isolation structure 800A. Accordingly, in the display apparatus according to an embodiment of the present disclosure, the penetration of external moisture through the light emitting layer 520 may be prevented by the isolation structure 800A.

The isolation structure 800A may be formed by a process of forming the first TFT 200 and the second TFT 300 and a process of forming the light emitting device 500. For example, a process of forming the isolation structure 800A may include a process of etching the second buffer layer 112, the first gate insulation layer 220, the first interlayer insulation layer 240, the first isolation layer 120, the second isolation layer 130, and the second interlayer insulation layer 340 in the isolation region SA by using a mask pattern of a process of forming the first and second source contact holes and the first and second drain contact holes.

A plurality of isolation structures 800A disposed in the isolation region SA may be removed by the etching process, and then, may be placed on the first buffer insulation layer 111 remaining. For example, a light emitting layer 5208 isolated by the plurality of isolation structures 800A disposed in the isolation region SA may be arranged in an island shape on the first buffer insulation layer 111 exposed between the isolation structures 800A.

The light emitting layer 5208 isolated in an island shape may extend along the same horizontal line as the device substrate 100. For example, the isolated light emitting layer 5208 may be stacked in a curve shape, and both end portions 8E thereof may be disposed at a position farther away from the device substrate 100 than a center portion 8C thereof in a vertical line.

The light emitting device 500 and the at least one isolation structure 800A may be covered and protected by an encapsulation part 170. For example, in order to prevent moisture from penetrating into the light emitting device 500 disposed in the pixel area PA, the encapsulation part 170 may extend and may be stacked on the isolation structure 800A disposed in the isolation region SA. A side surface of each of the second buffer insulation layer 112, the first gate insulation layer 220, the first interlayer insulation layer 240, the first isolation layer 120, the second isolation layer 130, and the second interlayer insulation layer 340, which are exposed between the isolation region SA and the pixel area PA through the etching process, may contact a first encapsulation layer 171 including an inorganic material.

Figure 8:
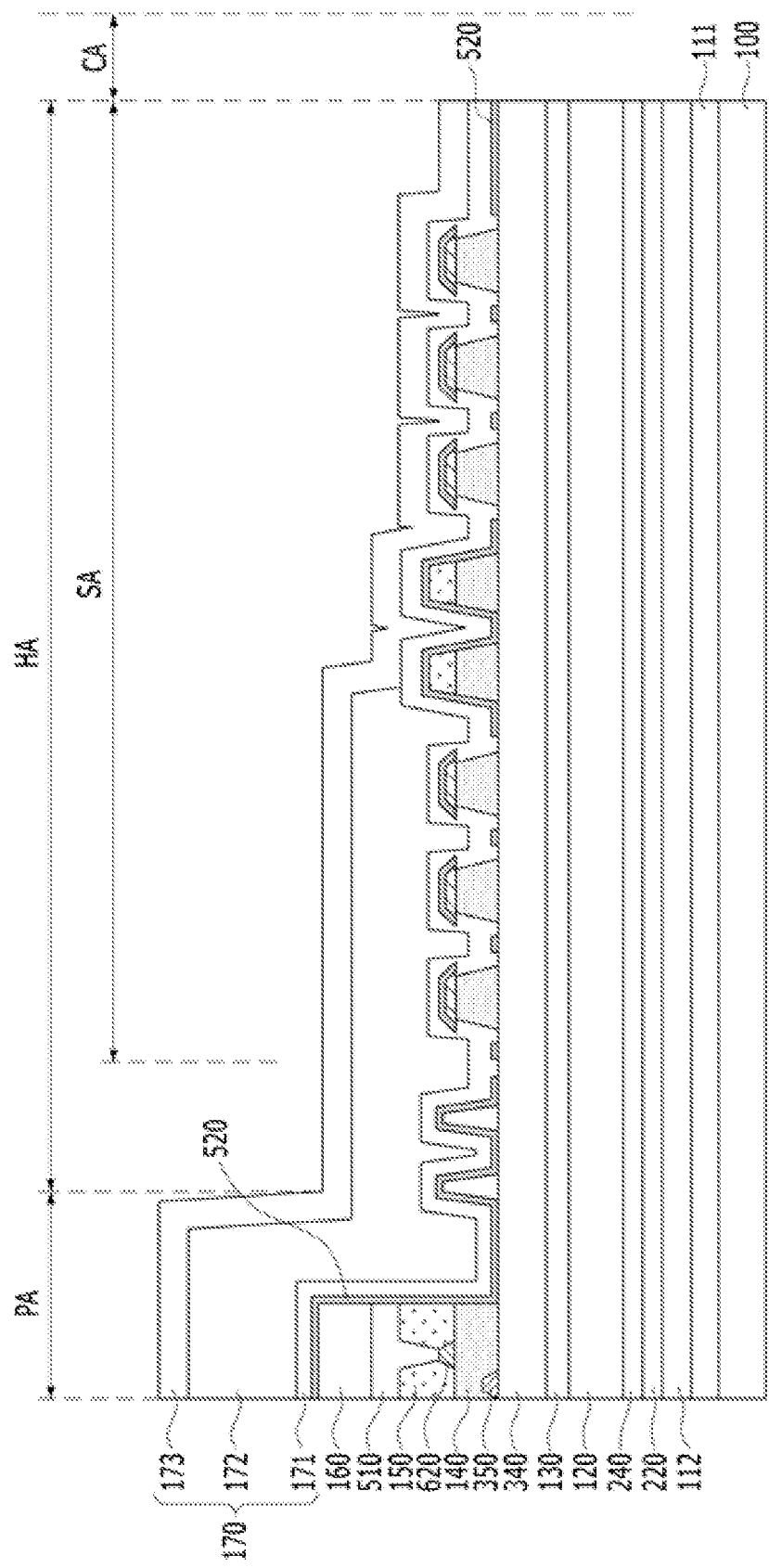
FIG. 8 is a diagram illustrating a display apparatus according to another embodiment of the present disclosure.
Figure 9:
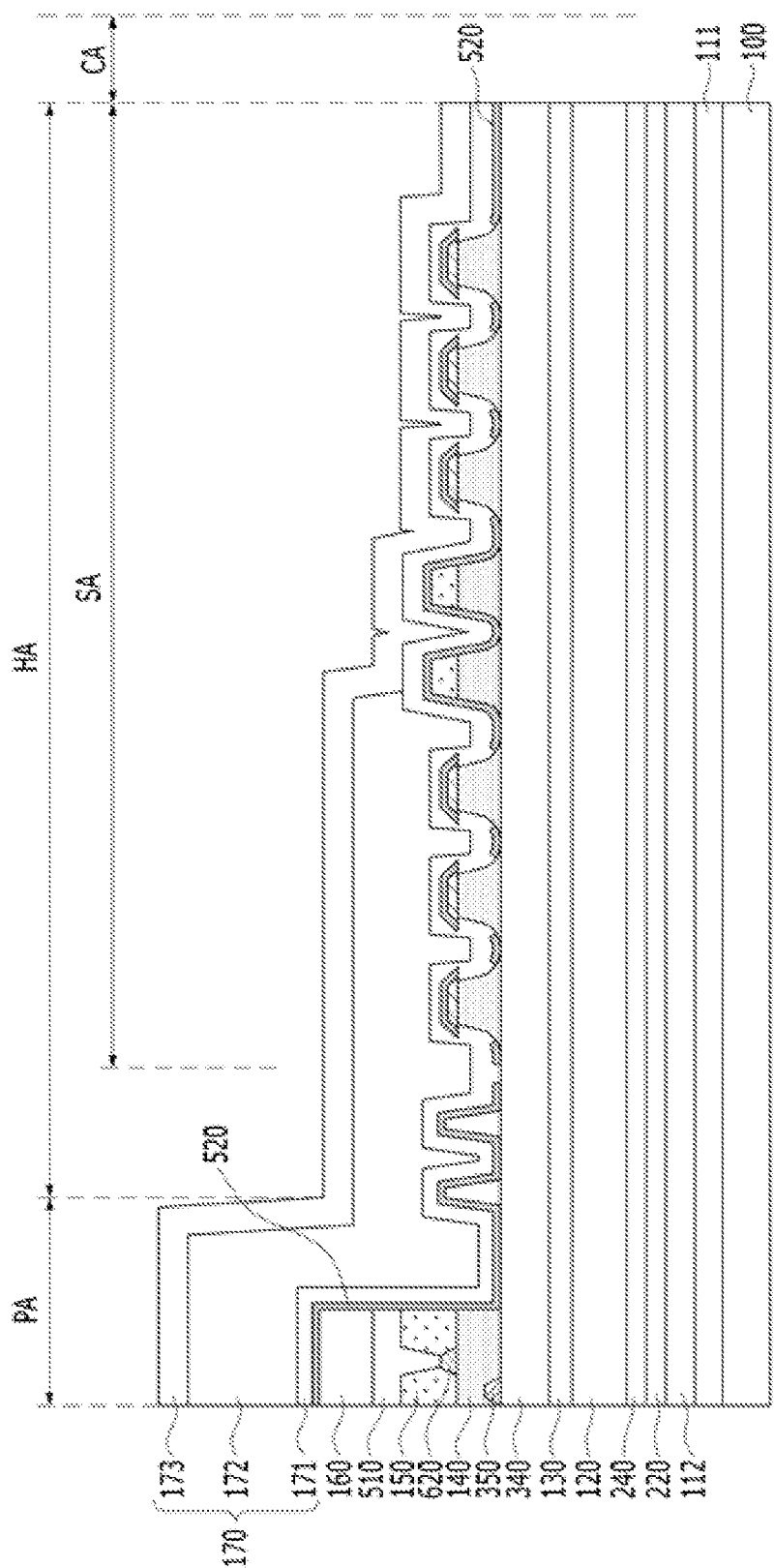
FIG. 9 is a diagram illustrating a display apparatus according to another embodiment of the present disclosure.

Referring to FIGS. 8 and 9, another embodiment of another isolation structure of a display apparatus DP according to the present disclosure is illustrated. Configurations of a first TFT 200, a second TFT 300, and a light emitting device 500 of a pixel area PA may be substantially the same as those of FIGS. 1 to 3. Also, a shape of each of a first structure and a second structure of an isolation device may be substantially the same as FIGS. 5 and 7.

A plurality of isolation structures disposed in the isolation region SA may be disposed on the second interlayer insulation layer 340. For example, a plurality of light emitting layers 5207 and 5208 isolated by the plurality of isolation structures disposed in the isolation region SA may be arranged in an island shape on the second interlayer insulation layer 340 exposed between the isolation structures.

Figure 10:
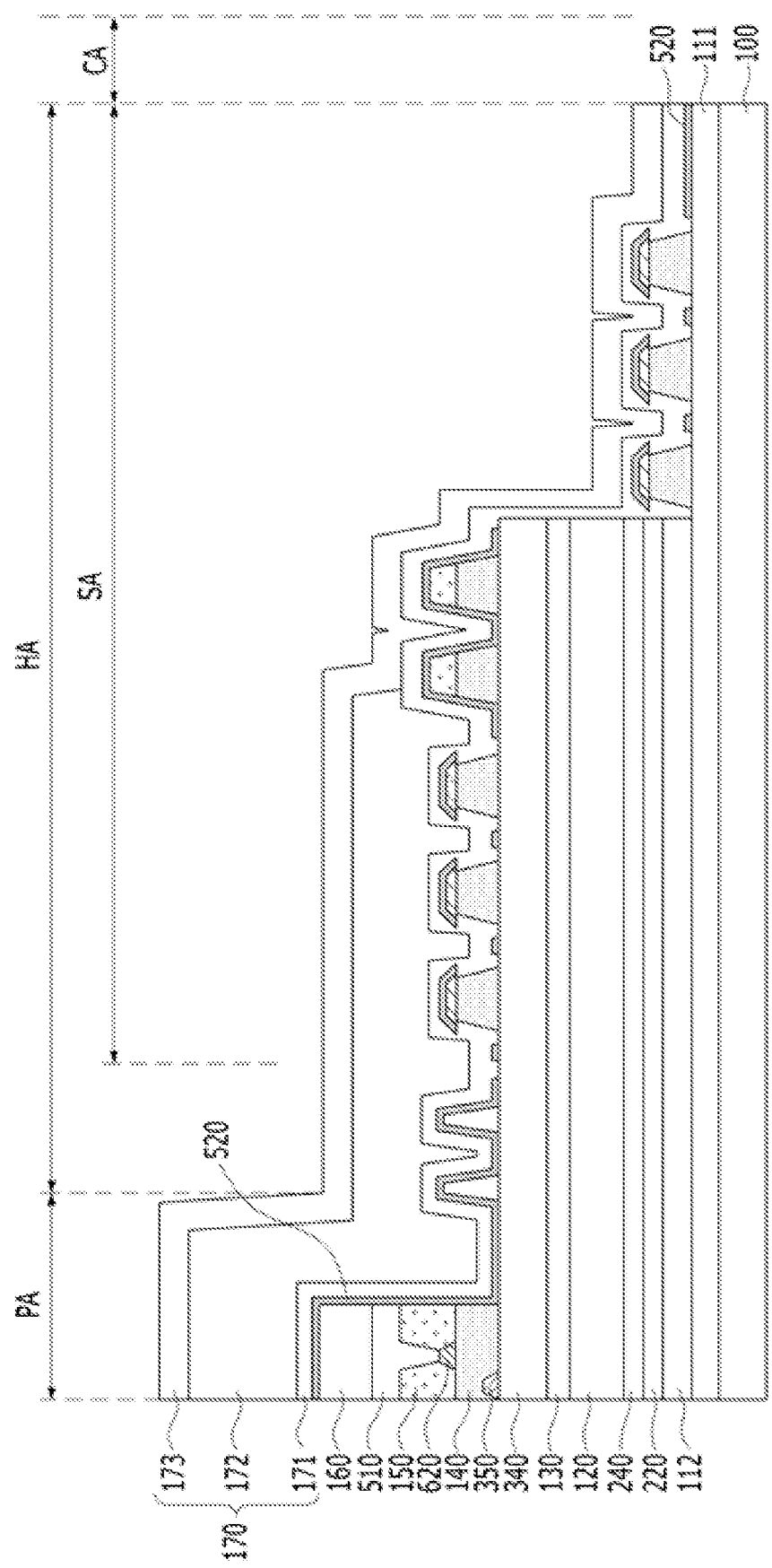
FIG. 10 is a diagram illustrating a display apparatus according to another embodiment of the present disclosure.
Figure 11:
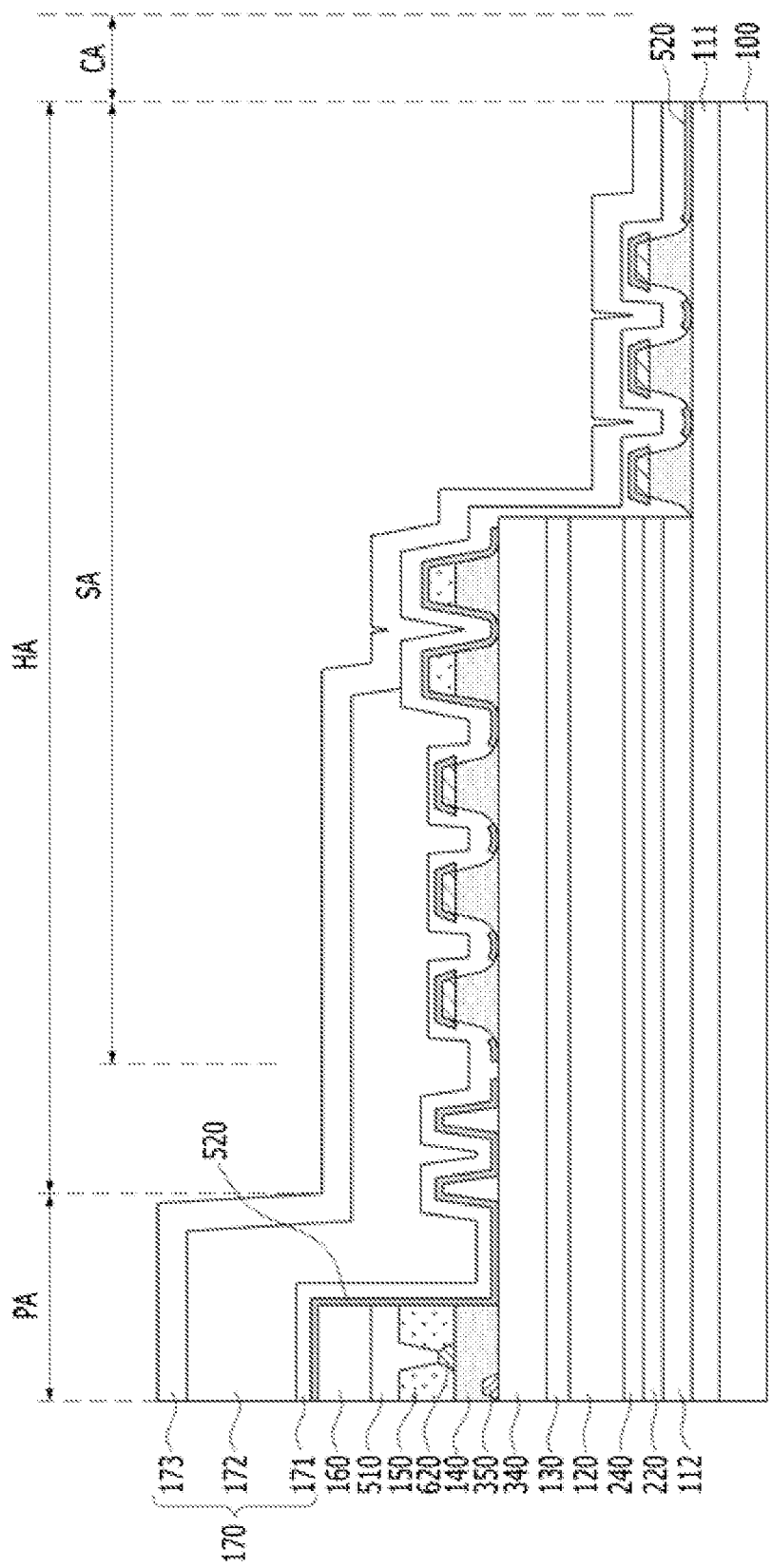
FIG. 11 is a diagram illustrating a display apparatus according to another embodiment of the present disclosure.

Referring to FIGS. 10 and 11, another embodiment of another isolation structure of a display apparatus DP according to the present disclosure is illustrated. Configurations of a first TFT 200, a second TFT 300, and a light emitting device 500 of a pixel area PA may be substantially the same as those of FIGS. 1 to 3. Also, a shape of each of a first structure and a second structure of an isolation device may be substantially the same as FIGS. 5 and 7. Also, the isolation structure according to the present embodiment may have a coupling structure of FIGS. 4 and 8 or FIGS. 6 and 9. For example, an isolation structure disposed between the dam 900 and the pixel area PA may be disposed on one of a first buffer insulation layer 111 and a second interlayer insulation layer 340, and an isolation structure disposed between the dam 900 and a through area CA may be disposed on one of the first buffer insulation layer 111 and the second interlayer insulation layer 340.

As a result, in the display apparatus DP according to an embodiment of the present disclosure, at least one isolation structure 700 may be disposed in a through region CA where a substrate hole CH is formed and an isolation region SA disposed between pixels PA, each isolation structure 700 may include at least one undercut structure, and a depth of each undercut structure may be greater than a thickness of a light emitting layer 520 of a light emitting device 500 disposed in each pixel area PA. Accordingly, in the display apparatus DP according to an embodiment of the present disclosure, the light emitting layer 520 may be completely isolated by the isolation structures 700A and 800A. That is, in the display apparatus DP according to an embodiment of the present disclosure, the damage of the light emitting device 500 caused by external moisture penetrating through the substrate hole CH may be effectively prevented. Also, in the display apparatus DP according to an embodiment of the present disclosure, the isolation structures 700A and 800A may be formed by using a process of forming a driving circuit and the light emitting device 500 of each pixel area PA. Accordingly, in the display apparatus DP according to an embodiment of the present disclosure, a reduction in process efficiency caused by a process of forming the isolation structures 700A and 800A may be prevented.

In the display apparatus according to the present disclosure, at least one isolation structure may be disposed between a substrate hole and a plurality of light emitting devices, each of the light emitting devices may include a light emitting layer disposed between a first electrode and a second electrode thereof, each of the at least one isolation structure may have at least one undercut structure, and each of the at least one undercut structure may have a height which is greater than a thickness of the light emitting layer. Therefore, in the display apparatus according to the present disclosure, a movement path of external moisture penetrating through the substrate hole may be blocked by the isolation structure. Accordingly, in the display apparatus according to the present disclosure, the lifetime and reliability of the light emitting devices may be enhanced.

The effects according to the present disclosure are not limited to the above examples, and other various effects may be included in the specification.

While the present disclosure has been particularly shown and described with reference to one or more embodiments thereof, it will be understood by those of ordinary skill in the art that various changes in form and details may be made therein without departing from the spirit and scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus comprising:
a buffer insulation layer on a substrate;
a substrate hole passing through the substrate and the buffer insulation layer;
at least one thin film transistor disposed on the substrate;
a light emitting device disposed on the substrate, spaced apart from the substrate hole, the light emitting device including a first electrode, a light emitting layer, and a second electrode;
first and second planarization layers disposed between the at least one thin film transistor and the light emitting device;
a plurality of isolation structures on the buffer insulation layer, the plurality of isolation structures disposed between the substrate hole and the light emitting device from a plan view; and
a connection electrode disposed between the first and second planarization layers and electrically connecting a drain electrode of the at least one thin film transistor to the first electrode,
wherein each isolation structure of the plurality of isolation structures includes a first structure and a second structure, the second structure disposed on a top surface of the first structure,
wherein the second structure has a width wider than a width of the first structure to define at least one undercut structure,
wherein a height of the at least one undercut structure is greater than a thickness of the light emitting layer,
wherein the second structure does not extend below the top surface of the first structure,
wherein the second structure is a same material as the connection electrode,
wherein a first portion of the light emitting layer is disposed on the second structure,
wherein the first portion of the light emitting layer disposed on the second structure does not extend below the top surface of the first structure,
wherein a second portion of the light emitting layer is different from the first portion of the light emitting layer, and
wherein the second portion of the light emitting layer is disposed between adjacent isolation structures of the plurality of isolation structures from a plan view.

2. The display apparatus of claim 1,
wherein the first structure is a same material as the planarization layer.

3. The display apparatus of claim 2, wherein the plurality of isolation structures is provided in plurality on the buffer insulation layer and directly contacts the buffer insulation layer.

4. The display apparatus of claim 3, wherein the light emitting layer is further disposed with an island shape on the buffer insulation layer exposed between the plurality of isolation structures.

5. The display apparatus of claim 4, wherein the light emitting layer having the island shape has a center portion and both ends being disposed on a same horizontal line.

6. The display apparatus of claim 4, wherein the light emitting layer having the island shape has a center portion and both ends, and
the both ends are farther away from the substrate than the center portion of the light emitting layer.

7. The display apparatus of claim 1, wherein the at least one thin film transistor includes a first thin film transistor and a second thin film transistor, and
a semiconductor pattern of the first thin film transistor includes low temperature poly-silicon, and a semiconductor pattern of the second thin film transistor includes an oxide semiconductor.

8. The display apparatus of claim 1, wherein each isolation structure of the plurality of isolation structures is spaced apart from each other,
wherein each isolation structure includes a portion of the light emitting layer that is disposed on the second structure.

9. The display apparatus of claim 8, wherein another portion of the light emitting layer is disposed between adjacent isolation structures of the plurality of isolation structures.

10. The display apparatus of claim 1, wherein a first height as defined by a distance between the top surface and the bottom surface of the first structure is greater than a second height defined by a distance between the top surface and the bottom surface of the second structure.

11. The display apparatus of claim 1, wherein the second portion of the light emitting layer is on and directly contacts the buffer insulation layer.

12. A display apparatus comprising:
a substrate including a substrate hole region and a pixel area;
a thin film transistor and a light emitting device disposed in each pixel of the pixel area;
a light emitting device disposed on the substrate, spaced apart from the substrate hole, the light emitting device including a first electrode, a light emitting layer, and a second electrode;
first and second planarization layers disposed between the at least one thin film transistor and the light emitting device;
a substrate hole disposed in the substrate hole region;
a plurality of isolation structures disposed between the substrate hole and the pixel area;
a connection electrode disposed between the first and second planarization layers and electrically connecting one of source and drain electrodes of the thin film transistor to the first electrode of the light emitting device; and an encapsulation part disposed on the pixel area and the plurality of isolation structures, wherein each isolation structure of the plurality of isolation structures includes a first structure and a second structure coupled to each other to configure an undercut structure, wherein the first structure has a top surface and a bottom surface and the second structure has a top surface and a bottom surface, wherein the bottom surface of the second structure does not extend below the top surface of the first structure, wherein a first portion of the light emitting layer is disposed on the second structure, and wherein a second portion of the light emitting layer different from the first portion of the light emitting layer is disposed between adjacent isolation structures of the plurality of isolation structures from a plan view.

13. The display apparatus of claim 12, wherein the thin film transistor includes:
an active layer,
a gate electrode,
a gate insulation layer between the active layer and the gate electrode,
the source and drain electrodes, and
an interlayer insulation layer and an isolation layer disposed between the gate insulation layer and the source or drain electrodes,
wherein the encapsulation part includes a first encapsulation layer including an inorganic material, a second encapsulation layer including an organic material, and a third encapsulation layer including an inorganic material.

14. The display apparatus of claim 12, wherein the first structure of the plurality of isolation structures includes a same material as a material of the planarization layer.

15. The display apparatus of claim 14, wherein
the substrate hole region includes a hole periphery region,
the hole periphery region includes an isolation region,
the plurality of isolation structures is provided in the isolation region, and
the gate insulation layer, the interlayer insulation layer, and the isolation layer of the pixel area do not extend to the isolation region.

16. The display apparatus of claim 15, wherein the first encapsulation layer at least partially covers a side surface of each of the gate insulation layer, the interlayer insulation layer, and the isolation layer exposed between the pixel area and the isolation region with contact.

17. The display apparatus of claim 12, wherein each isolation structure of the plurality of isolation structures is spaced apart from each other.

18. The display apparatus of claim 17, further comprising a buffer insulation layer on the substrate,
wherein a bottom surface of the first structure is on and contacts the buffer insulation layer.

19. The display apparatus of claim 18, wherein the second portion of the light emitting layer is on and directly contacts the buffer insulation layer.

* * * * *